(12) United States Patent
Kikuchi

(10) Patent No.: US 7,061,326 B2
(45) Date of Patent: Jun. 13, 2006

(54) TRANSMISSION CIRCUIT CAPABLE OF EFFICIENTLY OPERATING A POWER AMPLIFIER

(75) Inventor: Jiro Kikuchi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 74 days.

(21) Appl. No.: 10/858,530

(22) Filed: Jun. 1, 2004

(65) Prior Publication Data

US 2004/0246050 A1  Dec. 9, 2004

(30) Foreign Application Priority Data

Jun. 4, 2003  (JP) .............................. 2003-159070

(51) Int. Cl.
*H03G 3/20* (2006.01)

(52) U.S. Cl. ...................................... 330/285; 330/133

(58) Field of Classification Search ................ 330/133, 330/134, 285
See application file for complete search history.

(56) References Cited

U.S. PATENT DOCUMENTS 6,577,190 B1 *  6/2003  Kim ........................... 330/133

FOREIGN PATENT DOCUMENTS

| JP | 2002-290247 | 10/2002 |
| JP | 2003-008365 | 1/2003 |

* cited by examiner

*Primary Examiner*—Steven J. Mottola
(74) *Attorney, Agent, or Firm*—Brinks Hofer Gilson & Lione

(57) ABSTRACT

A power supply voltage required on the basis of information of setting transmission power to be output is supplied, thereby minimizing power consumption. A transmission circuit comprises a driver amplifier 3 whose gain is controlled by a first control voltage Vc1 for setting transmission power and a power amplifier 4 connected to the post-stage of the power amplifier 3. A power supply circuit 5 to which the first control voltage Vc1 is input and whose output voltage is controlled by the first control voltage Vc1 is provided. A voltage required for the power amplifier 4 when outputting the transmission power set by the first control voltage Vc1 is supplied from the power supply circuit 5.

3 Claims, 5 Drawing Sheets ically, to a transmission circuit that raises the
TRANSMISSION CIRCUIT CAPABLE OF EFFICIENTLY OPERATING A POWER AMPLIFIER This application claims the benefit of priority to Japanese Patent Application No. 2003-159070, herein incorporated by reference.

BACKGROUND OF THE INVENTION

1. Field of the Invention

The present invention relates to a transmission circuit, and more particularly, to a transmission circuit that raises the efficiency of a power amplifier of a portable telephone, etc.

2. Description of the Related Art

A conventional transmission circuit will be described with reference to FIG. 11. A power amplifier 20 has two amplifiers to the one amplifier on the input side of which Vdd1 is supplied as a power supply voltage and to the other amplifier on the output side of which Vdd2 is supplied as a power supply voltage. In order to control the power supply voltage Vdd1 and Vdd2 to maximize the efficiency of the power amplifier 20, a RAM 50, a control unit 30, and a DC/DC converter 40 are provided. A relational expression between the power supply voltage Vdd and an output voltage Pout is stored in the RAM 50, and the control unit 30 controls the DC/DC converter 40 on the basis of the output voltage Pout and the relational expression, and the DC/DC converter 40 lowers the voltage of a battery 60 on the basis of a control signal output from the control unit 30 to output the lowered voltage.

When the information on the output power Pout of the power amplifier 20 is input, the control unit 30 substitutes the value of the output power Pout for the relational expression stored in the RAM 50, so that the input voltage Vdd is calculated for operating the power amplifier 20 to the maximum efficiency. Next, the control unit 30 controls the DC/DC converter 40 so that the output voltage of the DC/DC converter 40 becomes the calculated value. As a result, the DC/DC converter 40 outputs a power supply voltage suitable for operating the power amplifier 20 most efficiently (for example, see Patent Document 1)

[Patent Document 1]

Japanese Unexamined Patent Application Publication No 2002-290247 (FIG. 1)

In the above configuration, since the actual output power is detected and the control unit sets a power supply voltage on the basis of the information on the output power, the power supply voltage that has been supplied until then, is changed, as a result of variations in the output power. Further, since the relationship between the power supply voltage and the information on what the output voltage should be set to is not considered, there is a big problem in that a power supply voltage required for a set arbitrary output power cannot be supplied.

SUMMARY OF THE INVENTION

It is an object of the present invention to supply a power supply voltage required on the basis of information of setting transmission power to be output, thereby minimizing power consumption.

In order to achieve the above object, the present invention provides a transmission circuit comprising a driver amplifier whose gain is controlled by a first control voltage for setting transmission power and a power amplifier connected to the post-stage of the power amplifier. A power supply circuit is provided to which the first control voltage is input and whose output voltage is controlled by the first control voltage. A voltage required for the power amplifier when outputting the transmission power set by the first control voltage is supplied from the power supply circuit.

Further, the power supply circuit comprises a DC/DC converter whose output voltage is proportional to a second control voltage and a control voltage converter circuit to which the first control voltage is input and that outputs the second control voltage. The control voltage converter circuit is configured such that the output voltage of the DC/DC converter is supplied to the power amplifier and the second control voltage is proportional to the required voltage.

Further, the relationship of the second control voltage with respect to the first control voltage is approximated to a plurality of continuous straight lines having gradually different inclinations at a plurality of points. Each of the control voltage converter circuit comprises a plurality of polygonal line amplifier circuits that amplify the first control voltage equal to or more than the value of the first control voltage corresponding to each of the points, an adder circuit that adds output voltages of the respective polygonal line amplifier circuits, and an inverting circuit that inverts the output voltage of the adder circuit. The second control voltage is output from the inverting circuit.

Further, each of the polygonal line amplifier circuits comprises a first operational amplifier to an inverting input terminal of which a comparison voltage equal to the value of the first control voltage corresponding to each of the points is input and to a non-inverting input terminal of which the first control voltage is input. The adder circuit comprises a second operational amplifier to an inverting input terminal of which the output voltage of each of the polygonal line amplifier circuits is input and to a non-inverting input terminal of which a first reference voltage is input. The inverting circuit comprises a third operational amplifier to an inverting input terminal of which the output voltage of the adder circuit is input and to a non-inverting input terminal of which a second reference voltage is input. A differential voltage between the first reference voltage and the second reference voltage is caused to correspond to a supply voltage of the power amplifier corresponding to the lowest value of the first control voltage.

DESCRIPTION OF THE PREFERRED EMBODIMENT

Figure 1:
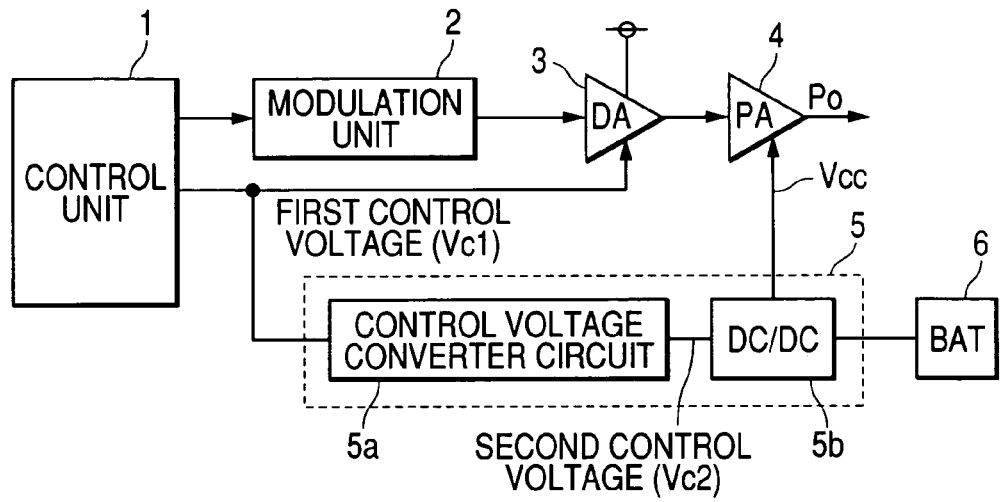
FIG. 1 is a block diagram illustrating a transmission circuit according to the present invention.

The configuration of a transmission circuit according to the present invention is shown in FIG. 1. A control circuit 1 transmits a base band signal to a modulation unit 2, the modulation unit 2 modulates a carrier wave by the input base band signal, and the modulated high frequency signal (transmission signal) is output from the modulation unit 2. The transmission signal is amplified by a driver amplifier 3, is further amplified by a power amplifier 4, and is output to an antenna (not shown). A power supply voltage Vcc is supplied to the power amplifier 4 from the power supply circuit 5. The driver amplifier 3 comprises a variable gain amplifier whose gain is controlled by a bias voltage.

Moreover, the control unit 1 outputs a first control voltage Vc1 for setting the transmission power Po of the transmission signal output from the power amplifier 4, and the first control voltage Vc1 is applied to the driver amplifier 3 as a bias voltage. The first control voltage Vc1 is also input to the power supply circuit 5. The power supply circuit 5 consists of a control voltage converter circuit 5a and a DC/DC converter 5b. The first control voltage Vc1 is input to the control voltage converter circuit 5a, and a battery voltage from the battery (BATT) 6 is supplied to the DC/DC converter 5b. The control voltage converter circuit 5a outputs a second control voltage Vc2 proportional to a voltage that is required when a power amplifier 4 outputs the transmission power Po set by the first control voltage Vc1. Here, the required voltage indicates the lowest voltage required for operating the power amplifier 4 when outputting the transmission power Po thereof below a predetermined degree of distortion.

The second control voltage Vc2 is input to the DC/DC converter 5b. The DC/DC converter 5b converts a battery voltage supplied from the battery 6 into an output voltage proportional to the second control voltage Vc2 and supplies the output voltage thereof as a power supply voltage Vcc of the power amplifier 4.

Figure 2:
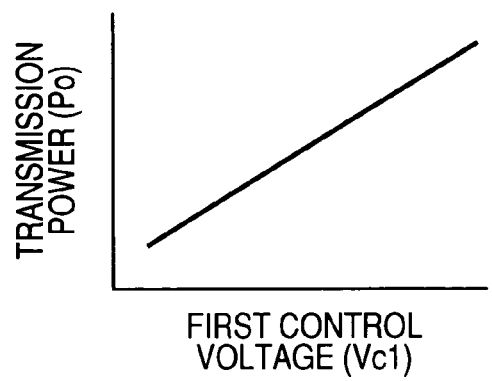
FIG. 2 is a graph illustrating the characteristic of the transmission power of a power amplifier in the transmission circuit according to the present invention.
Figure 3:
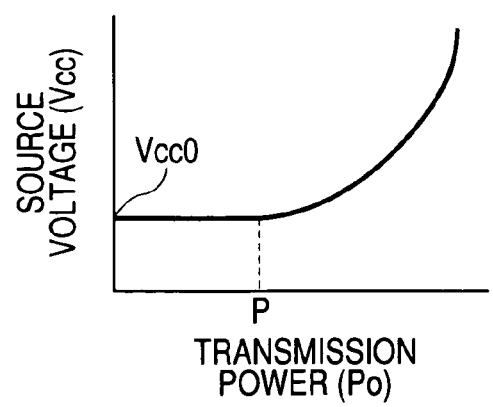
FIG. 3 is a graph illustrating the characteristic of a power supply voltage required for the power amplifier in the transmission circuit according to the present invention.

Here, the transmission power Po set by the first control voltage Vc1 is represented nearly linearly as shown in FIG. 2. Further, since the power amplifier 5 is distorted with an increase in the transmission power Po, the power supply voltage Vcc required for the power amplifier 4 with respect to the transmission power Po set by the first control voltage Vc1 becomes large so as to suppress the distortion. Here, as shown in FIG. 3, when the transmission power Po is within a low range (up to P), the power supply voltage Vcc may be a nearly constant voltage Vcc0. However, when the transmission power $P_0$ exceeds the power (P), the power supply voltage Vcc needs to be increased according to the relationship almost approximating a square law. Accordingly, the power supply voltage Vcc required for the power amplifier 4 with respect to the first control voltage Vc1 becomes almost the voltage Vcc0 up to the voltage E1 corresponding to a point P of FIG. 3 as in FIG. 4. However, when the power supply voltage exceeds the voltage E1, it increases according to the relationship approximating a square law. Therefore, the relationship between the first control voltage Vc1 and the second control voltage Vc2 resembles a line shown in FIG. 4 as shown by the solid line A of FIG. 5 (because the second control voltage Vc2 input to the DC/DC converter 5b and the output voltage thereof has a linear relationship), and the second control voltage Vc2 becomes a nearly constant voltage Vc20 within the range to the voltage E1.

Figure 4:
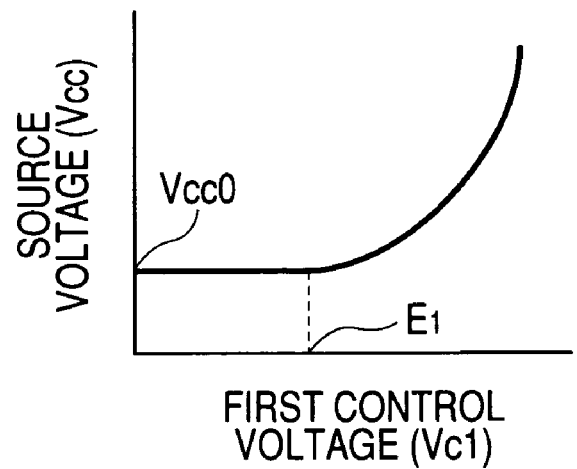
FIG. 4 is a graph illustrating the characteristic of a power supply voltage required for the power amplifier in the transmission circuit according to the present invention.

Thus, when the transmission power Po of the power amplifier 4 and the power supply voltage Vcc required when outputting the transmission power thereof are measured to obtain the relationship in FIG. 3, and based on the results, a voltage having the relationship in FIG. 4 which is required when outputting the set transmission power Po is supplied to the power amplifier 4 from the power supply circuit 5 to which the first control voltage Vc1 is input, preventing power from being wastefully consumed.

Here, the relationship of the second control voltage Vc2 to the first control voltage Vc1 is approximated to the polygonal line consisting of a plurality of continuous straight lines B1, B2 and B3 joined at a plurality of points P1 and P2, with each being more steeply inclined than the last. In other words, the second control voltage Vc2 is a nearly constant voltage Vc20 as in the straight line B1 until the first control voltage Vc1 reaches a voltage E1 corresponding to the point P1, the second control voltage Vc2 is steeply inclined as in the straight line B2 within the range from the voltage E1 corresponding to the point P1 to a voltage E2 corresponding to the point P2, and the second control voltage Vc2 is further steeply inclined above the voltage E2 corresponding to the point P2.

Figure 5:
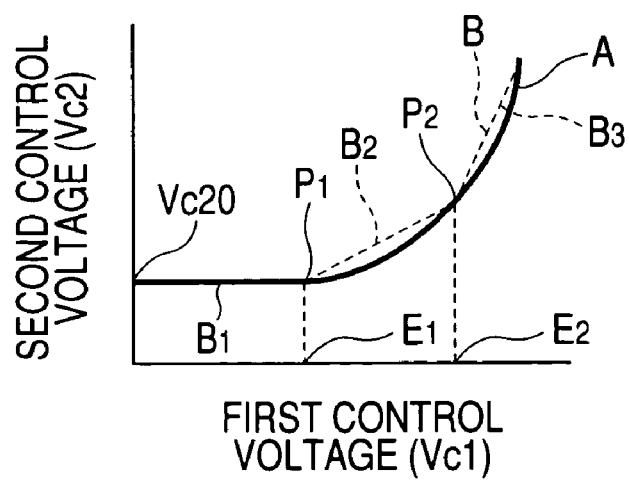
FIG. 5 is a graph illustrating the characteristic of a control voltage converter circuit in the transmission circuit according to the present invention.
Figure 6:
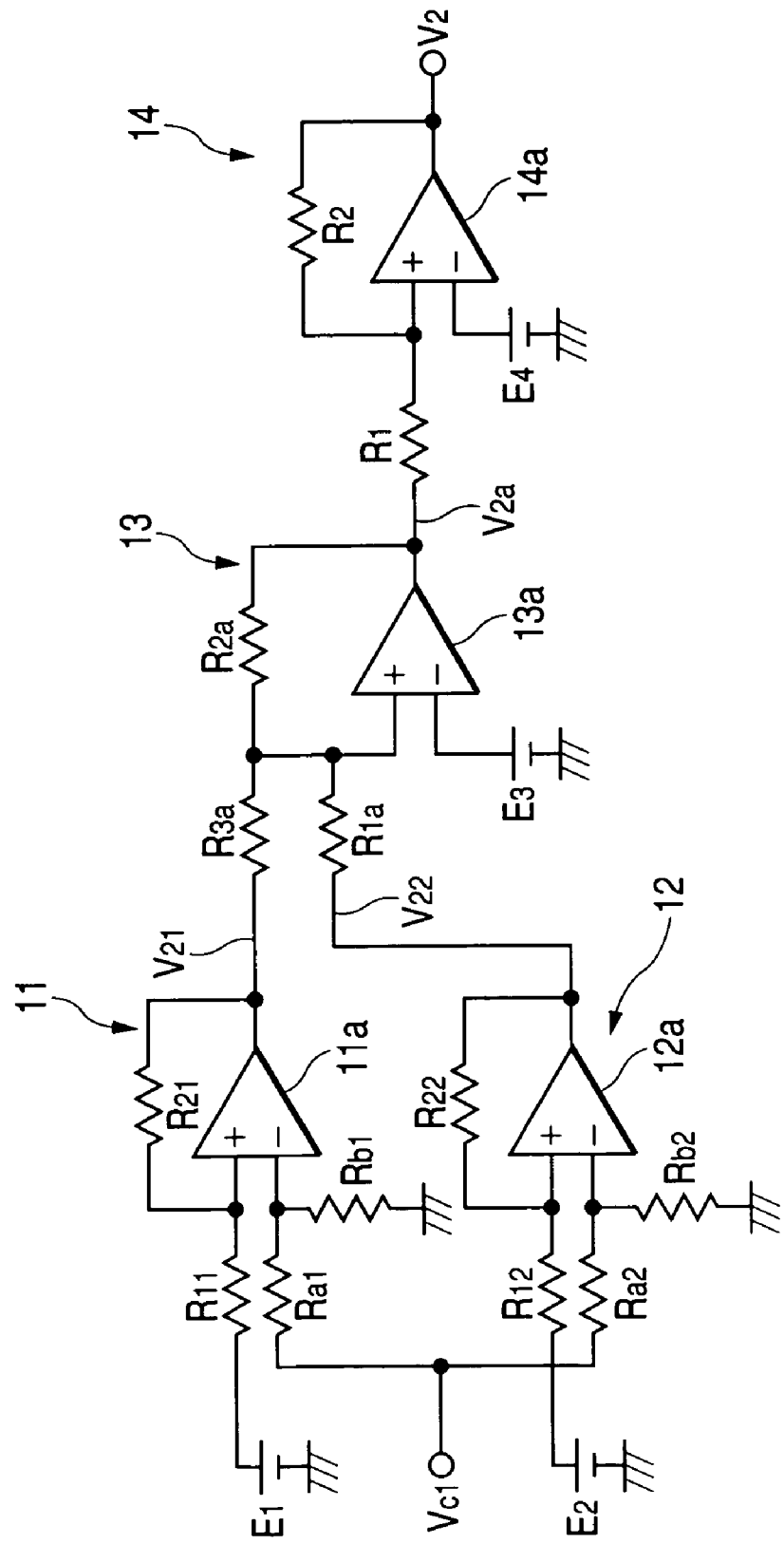
FIG. 6 is a specific circuit diagram of the control voltage converter circuit in the transmission circuit according to the present invention.

FIG. 6 illustrates a control voltage converter circuit 5a configured to have the characteristic approximating the straight line B in FIG. 5. The control voltage converter circuit 5a comprises a plurality of polygonal line amplifier circuits 11 and 12, an adder circuit 13 and an inverting circuit 14.

The polygonal line amplifier circuit 11 includes a first operational amplifier 11a to an inverting input terminal (−) of which the voltage E1 (referred to as a comparison voltage) equal to the value of the first control voltage Vc1 corresponding to the point P1 is input via an input resistor R11, and to a non-inverting input terminal (+) of which the first control voltage Vc1 is input via an input resistor Ra1. A feedback resistor R21 is connected between the inverting input terminal (−) and the output terminal, and the non-inverting input terminal (+) is grounded via a grounding resistor Rb1.

Similarly, the polygonal line amplifier circuit 12 also includes the same first power amplifier 12a to an inverting input terminal (−) of which a comparison voltage E2 equal to a value of the first control voltage Vc1 corresponding to the point P2 is input via an input resistor R12, and to a non-inverting input terminal (+) of which the first control voltage Vc1 is input via an input resistor Ra2. A feedback resistor 22 is connected between the inverting input terminal (−) and the output terminal, and the non-inverting input terminal (+) is grounded via a grounding resistor Rb2.

A voltage V21 output from one polygonal line amplifier circuit 11 is defined as Expression (1)

$$V21 = K31 \times Vc1 - K11 \times E1 \tag{1}$$

Further, a voltage V22 output from the other polygonal line amplifier circuit 12 is defined as Expression (2)

$$V22=K32 \times Vc1-K12 \times E2 \quad (2)$$

where K31={(R11+R21)×Rb1}/{R11×(Rb1+Ra1)} and K11=R21/R11. Further, K32={(R12+R22)×Rb2}/{R12×(Rb2+Ra2)}, and K12=R22/R12.

Generally, if an input resistor of the inverting input terminal (−) of each operational amplifier is denoted by R1$n$, a feedback resistor by R2$n$, an input resistor of the non-inverting input terminal (+) by Ran, a grounding resistor by Rbn, and a comparison voltage by En, the general expression of the output voltage V2$n$ is defined as:

$$V2n=K3n \times Vc1-K1n \times En$$

where K3$n$={(R1$n$+R2$n$)×(Rbn)}/{R1$n$×(Rbn+Ran)}

Figure 7:
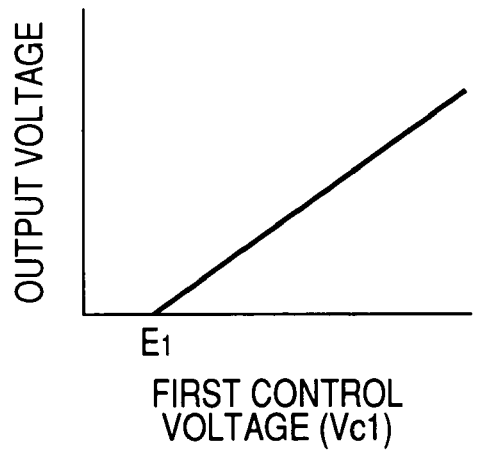
FIG. 7 is a graph illustrating the characteristic of a polygonal line amplifier circuit in the transmission circuit according to the present invention.
Figure 8:
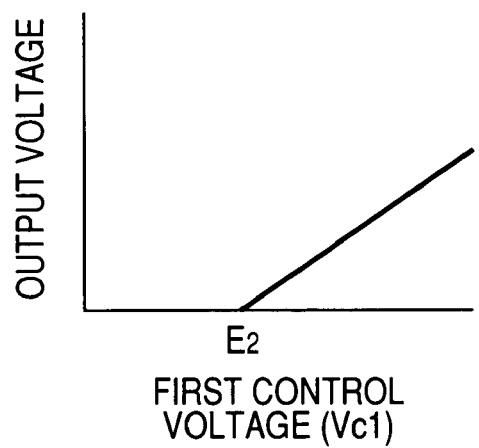
FIG. 8 is a graph illustrating the characteristic of the polygonal line amplifier circuit in the transmission circuit according to the present invention.

Therefore, when the first control voltage Vc1 is below the comparison voltage E1, as shown in FIG. 7, a voltage is not output from the polygonal line amplifier circuit 11, and when the first control voltage Vc1 exceeds the comparison voltage E1, a voltage proportional to the first control voltage Vc1 is output. When the first control voltage Vc1 is below the comparison voltage E2, as shown in FIG. 8, a voltage is not output from the polygonal line amplifier circuit 12, and when the first control voltage Vc1 exceeds the comparison voltage E2, a voltage proportional to the first control voltage Vc1 is output. In other words, when the first control voltages Vc1 to be input are above the comparison voltages E1 and E2 respectively, voltages according to the gains defined in the above Expressions are output.

The output voltages of the two polygonal line amplifier circuits 11 and 12 are input via input resistors R3$a$ and R1$a$ to an inverting input terminal (−) of a second operational amplifier 13$a$ that constitutes the adder circuit 13. A feedback resistor R2$a$ is connected between the inverting input terminal (−) and the output terminal. A first reference voltage E3 is applied to a non-inverting input terminal (+). Therefore, a voltage V2$a$ output from the adder circuit 13 is defined as Expression (3).

$$V2a=-(K1a \times V21+K3a \times V22) \quad (3)$$

where K1$a$=R2$a$/R3$a$, and K3$a$=R2$a$/R1$a$.

As apparent from Expression (3), when the first control circuit Vc1 is below the lower comparison voltage E1 (where E1<E2), the output voltage V2$a$ becomes a nearly constant voltage E3 (see b1 in FIG. 9), when the first control voltage Vc1 is within the range of E1<Vc1<E2, the output voltage V2$a$ has a characteristic in which the sign of the inclination in Expression (1) is inverted (see b2 in FIG. 9), and when the first control voltage Vc1 is E2, the output voltage V2$a$ has a characteristic in which the sign of the inclination of the sum of Expressions (1) and (2) is inverted (see b3 in FIG. 9).

The inverting circuit 14 includes a third operational amplifier 14$a$, and the voltage V2$a$ output from the adder circuit 13 is input to an inverting input terminal (−) via an input resistor R1. A feedback resistor R2 is connected between the output terminal and the inverting input terminal (−). Further, a second reference voltage E4 is applied to the non-inverting input terminal (+). Therefore, the voltage V2 output from the inverting circuit 14 is defined as Expression (4).

$$V2=-KV2a \quad (4)$$

where K=R2/R1

Figure 9:
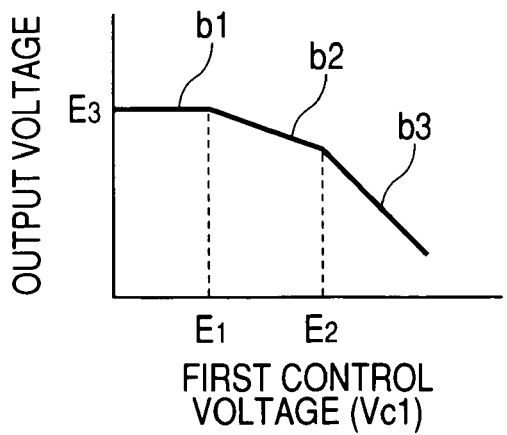
FIG. 9 is a graph illustrating the characteristic of an adder circuit in the transmission circuit according to the present invention.
Figure 10:
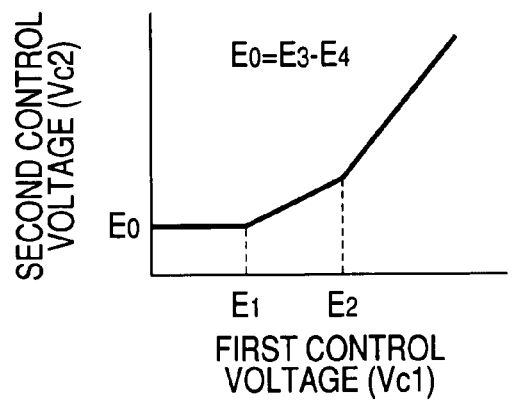
FIG. 10 is a graph illustrating the characteristic of an inverting circuit in the transmission circuit according to the present invention.
Figure 11:
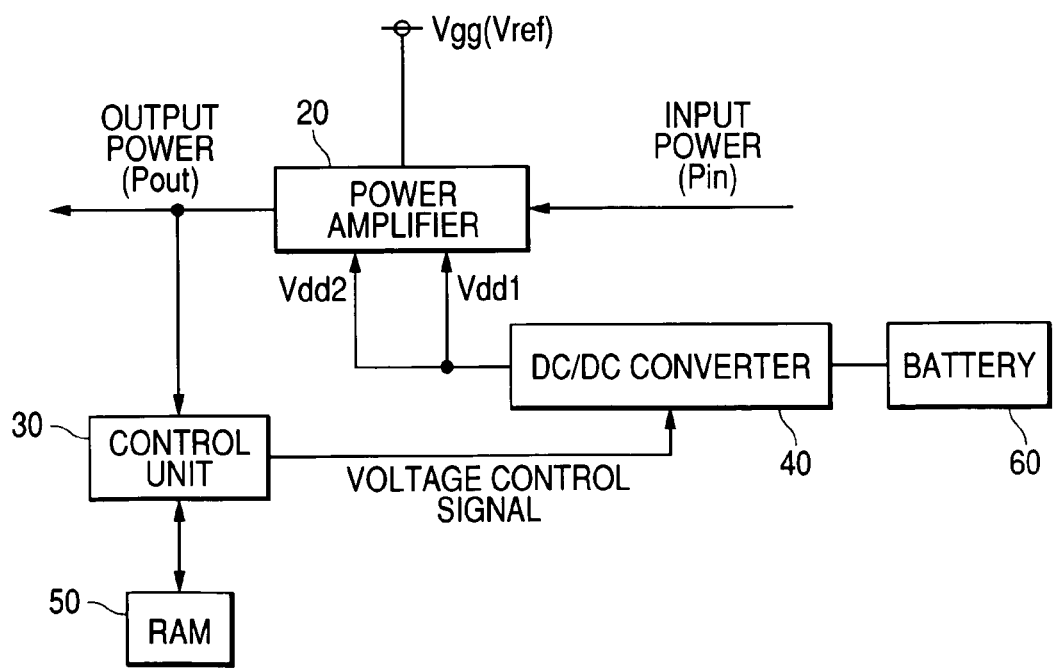
FIG. 11 is a block diagram illustrating a conventional transmission circuit.

As shown in FIG. 10, the relationship in Expression (4) is obtained by inverting the relationship in FIG. 9. Also, when the first control voltage Vc1 is below the comparison voltage E1, the output voltage V2 becomes a constant voltage E0 where E0=E3−E4.

Therefore, if E3 and E4 are set to be the lowest second control voltage Vc20 in FIG. 5, the voltage V2 output from the inverting circuit 14 becomes the second control voltage Vc2 and coincides with the approximated polygonal line B in FIG. 5. Also, if the voltage is input to the DC/DC converter 5$b$, the power supply voltage Vcc required for the transmission power set by the first control voltage Vc1 is supplied to the power amplifier 4 from the DC/DC converter 5$b$.

In the present invention, the second control voltage Vc2 can be approximated to simply configure the control voltage converter circuit 5$a$. Further, if the number of polygonal line amplifiers is increased, the second control voltage can be more accurately generated.

As described above, a transmission circuit comprises a driver amplifier whose gain is controlled by a first control voltage for setting transmission power and a power amplifier connected to the post-stage of the power amplifier. A power supply circuit to which the first control voltage is input and whose output voltage is controlled by the first control voltage is provided. A voltage required for the power amplifier when outputting the transmission power set by the first control voltage is supplied from the power supply circuit. Thus, a required voltage can be reliably applied to the power amplifier. Therefore, the power consumption can be minimized.

Further, the power supply circuit comprises a DC/DC converter whose output voltage is proportional to a second control voltage and a control voltage converter circuit to which the first control voltage is input and that outputs the second control voltage. The control voltage converter circuit is configured such that the output voltage of the DC/DC converter is supplied to the power amplifier and the second control voltage is proportional to the required voltage. Thus, a required voltage can be supplied from the DC/DC converter.

Further, the relationship of the second control voltage with respect to the first control voltage is approximated by a plurality of continuous straight lines having gradually different inclinations at a plurality of points. The control voltage converter circuit comprises a plurality of polygonal line amplifier circuits that amplify the first control voltage equal to or more than a value of the first control voltage corresponding to each of the points, an adder circuit that adds output voltages of the respective polygonal line amplifier circuits, and an inverting circuit that inverts the output voltage of the adder circuit. The second control voltage is output from the inverting circuit. Thus, the second control voltage can be simply generated.

Further, each of the polygonal line amplifier circuits comprises a first operational amplifier to an inverting input terminal of which a comparison voltage equal to the value of the first control voltage corresponding to each of the points is input and to a non-inverting input terminal of which the first control voltage is input. The adder circuit comprises a second operational amplifier to an inverting input terminal of which the output voltage of each of the polygonal line amplifier circuits are input and to a non-inverting input terminal of which a first reference voltage is input. The inverting circuit comprises a third operational amplifier to an inverting input terminal of which the output voltage of the adder circuit is input and to a non-inverting input terminal of which a second reference voltage is input. A differential voltage between the first reference voltage and the second reference voltage is caused to correspond to a supply voltage of the power amplifier corresponding to the lowest value of the first control voltage, so that the approximated second voltage can be easily obtained by setting the gains of the polygonal line amplifier circuit, the comparative voltage, and the reference voltage.

What is claimed is:

1. A transmission circuit comprising a driver amplifier whose gain is controlled by a first control voltage for setting transmission power and a power amplifier connected to a post-stage of the driver amplifier,
    wherein a power supply circuit to which the first control voltage is input and whose output voltage is controlled by the first control voltage is provided,
    wherein a voltage required for the power amplifier when outputting the transmission power set by the first control voltage is supplied from the power supply circuit;
    wherein the power supply circuit comprises a DC/DC converter whose output voltage is proportional to a second control voltage and a control voltage converter circuit to which the first control voltage is input and that outputs the second control voltage, and
    wherein the control voltage converter circuit is configured such that the output voltage of the DC/DC converter is supplied to the power amplifier and the second control voltage is proportional to a required voltage.

2. The transmission circuit according to claim 1 wherein the relationship of the second control voltage with respect to the first control voltage is approximated by a plurality of continuous straight lines having gradually different inclinations at a plurality of points,
    wherein, the control voltage converter circuit comprises a plurality of polygonal line amplifier circuits that amplify the first control voltage equal to or more than a value of the first control voltage corresponding to each of the points, an adder circuit that adds output voltages of the respective polygonal line amplifier circuits, and an inverting circuit that inverts the output voltage of the adder circuit, and
    wherein the second control voltage is output from the inverting circuit.

3. The transmission circuit according to claim 2,
    wherein each of the polygonal line amplifier circuits comprises a first operational amplifier to an inverting input terminal of which a comparison voltage equal to the value of the first control voltage corresponding to each of the points is input and to a non-inverting input terminal of which the first control voltage is input, and
    wherein the adder circuit comprises a second operational amplifier to an inverting input terminal of which the output voltage of each of the polygonal line amplifier circuit is input and to a non-inverting input terminal of which a first reference voltage is input, and
    wherein the inverting circuit comprises a third operational amplifier to an inverting input terminal of which the output voltage of the adder circuit is input and to a non-inverting input terminal of which a second reference voltage is input, and
    wherein a differential voltage between the first reference voltage and the second reference voltage is caused to correspond to a supply voltage of the power amplifier corresponding to a lowest value of the first control voltage.

* * * * *